July 6, 1954

J. F. ROACH 2,683,204

CIRCUITS FOR WELDING SEMICONDUCTOR DEVICES

Filed Dec. 21, 1950

INVENTOR.
JACK F. ROACH,
BY Nicholas T Volsk
atty.

Patented July 6, 1954

2,683,204

UNITED STATES PATENT OFFICE 2,683,204

CIRCUITS FOR WELDING SEMICONDUCTOR DEVICES

Jack F. Roach, Van Nuys, Calif., assignor, by mesne assignments, to Hughes Aircraft Company, a corporation of Delaware Application December 21, 1950, Serial No. 202,021

6 Claims. (Cl. 219—4)

This invention relates to circuits for welding semiconductor devices, and more particularly to circuits for producing welded and annealed joints between very fine wire electrodes and a semiconductor crystal and requiring very small quantities of electrical energy.

This invention will be described in connection with semiconductor crystal diodes, and more particularly in connection with circuits for making welded contacts between the crystal and the cat-whisker electrode. It is to be understood, however, that the apparatus disclosed in this application may be employed for welding other small objects which, because of their small dimensions, require a carefully controlled amount of electrical energy for establishing and annealing the weld.

If the amount of electrical energy used for producing a welded contact between the cat whisker and crystal element of a semiconductor device is not controlled with the utmost care, burn-out or blow-out may occur at the weld. Burn-outs or blow-outs take place when the contact areas between the two objects to be welded are overheated, with the result that either one or both objects reach their melting point temperature. When this occurs, the melted material leaves the area of contact through sputtering, and may even destroy direct contact between the two objects.

It is therefore an object of this invention to provide apparatus for establishing an annealed welded joint between the cat whisker and crystal element of a semiconductor device.

It is also an object of this invention to provide a welding apparatus for supplying a predetermined amount of electrical energy in a predetermined interval of time, at a predetermined rate, to the contact area between a cat whisker and a semiconductor for producing positive, uniform, and fully reproducible welded joints between the cat whisker and the semi-conductor.

It is also an object of this invention to provide an electrical network, including a serially connected resistor-condenser-inductor combination, for supplying a predetermined amount of energy at a predetermined but variable rate for establishing and annealing a welded joint between the electrode and the crystal element in a semi-conductor translating device.

Still another object of this invention is to provide apparatus for establishing highly reproducible annealed welded contacts between a fine wire electrode and a semi-conductor by means of a pulse-forming network capable of furnishing a very exact amount of electrical energy at a predetermined rate for making and annealing the weld in an automatic manner.

The novel features which are believed to be characteristic of the invention, both as to its organization and method of operation, together with further objects and advantages thereof, will be better understood from the following description considered in connection with the accompanying drawing in which several embodiments of the invention are illustrated by way of examples. It is to be expressly understood, however, that the drawings are for the purpose of illustration and description only, and are not intended as a definition of the limits of the invention.

Welded contacts in semiconductor devices are known in the art and are described in the "Journal of Applied Physics," vol. 17, page 912 et seq., November 1946, in the article entitled "Properties of Welded Contact Germanium Rectifier," by H. Q. North. The method of making welded contacts described in the above publication is as follows.

Direct current is passed through the contact by manually adjusting a rheostat until a specific current has been reached, and the current is then reduced to zero by manual operation. The length of time for obtaining the specified current, and then reducing it to zero, is at the discretion of the operator and has been considered to be unimportant heretofore. The welds so produced are satisfactory in some cases; however, when manual operation of the rheostat is used, it follows logically that the uniformity and reproducibility of the welds depend continuously on a human factor. Accordingly, frequent cases of failure to establish a weld or to produce a satisfactory weld occur. Similarly, annealing the weld by manually adjusting the rheostat, is erratic and not reproducible from one diode to another.

According to the present invention, the welding apparatus provides an asymmetric current pulse having a relatively steep wave front and gradually decaying portion, the steep wave front furnishing, in a short period of time, the exact amount of energy necessary for establishing an optimum weld, and the decaying portion of the wave furnishing a gradually reduced amount of energy for gradual annealing of the established welded joint welding. The period, as well as the amount of energy furnished for establishing the weld, can be adjusted readily during the preliminary adjustment of the electrical components of the network. In a similar manner, the decaying portion of the current pulse may be readily controlled. Once the entire pulse wave form has been determined, it will reproduce itself with all the exactitude and precision possible with pulse-forming networks, thus eliminating any possibility of human error and the concomitant lack of reproducibility so common in the prior art.

Figure 1:
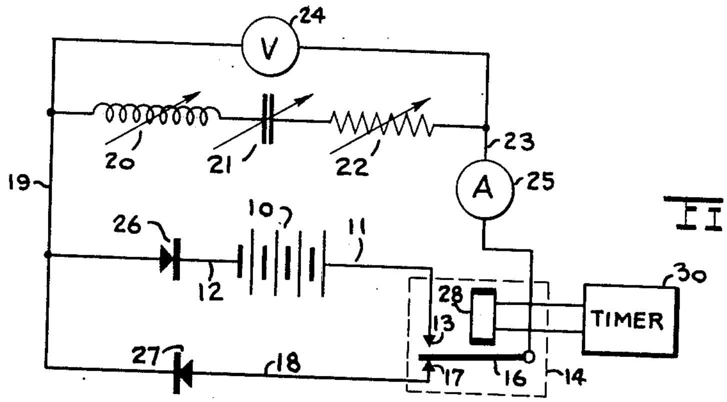
Fig. 1 is a schematic diagram of one form of welding apparatus according to the invention.

Referring now to Fig. 1, a source 10 of direct current potential is connected to two conductors 11 and 12. Conductor 11 terminates at a front contact 13 of a two-position relay 14, an armature 16 of which may be switched to contact 13 or to a back contact 17 by means of a relay winding 28. Contact 17 is connected by a conductor 18 to one terminal of a diode 27 which is to be welded, the other terminal of diode 27 being connected by a conductor 19 to a serially connected network including a variable inductor 20, a variable condenser 21, and a rheostat 22. The circuit is completed by a conductor 23 which interconnects rheostat 22 to armature 16. A voltmeter 24 and an ammeter 25 may be included in the circuit during preliminary adjustment of the network to achieve the desired waveshape in the welding and annealing pulse. In addition, a diode 26 may be connected in series with source 10 when it is desired to weld during the charging cycle as well as the discharging cycle of the pulse-forming network. It is clear, of course, that the circuit may be employed with a single diode instead of with two, as shown. The welding operation is then performed during either the charging or discharging cycle of the network.

The operation of the circuit and the method of obtaining annealed welded joints is as follows: Armature 16 is first connected to contact 13 which connects the pulse-forming network to the source of direct current potential 10. Current flows from the potential source 10 raising the voltage across the plates of condenser 21 to that of source 10. The charging rate of condenser 21 is controlled by inductor 20, rheostat 22, the amplitude of the potential from source 10, and the resistance of diode 26. The general equation for current flow in this circuit is:

$$L\frac{di}{dt}+iR_t+\frac{1}{C}\int idt=E \qquad (1)$$

where

L is the inductance of inductor 20;
$R_t$ is the total resistance of the charging circuit;
C is the capacitance of condenser 21;
$i$ is the current flowing in the circuit;
$t$ is time at any given instant.

Figures 4, 5:
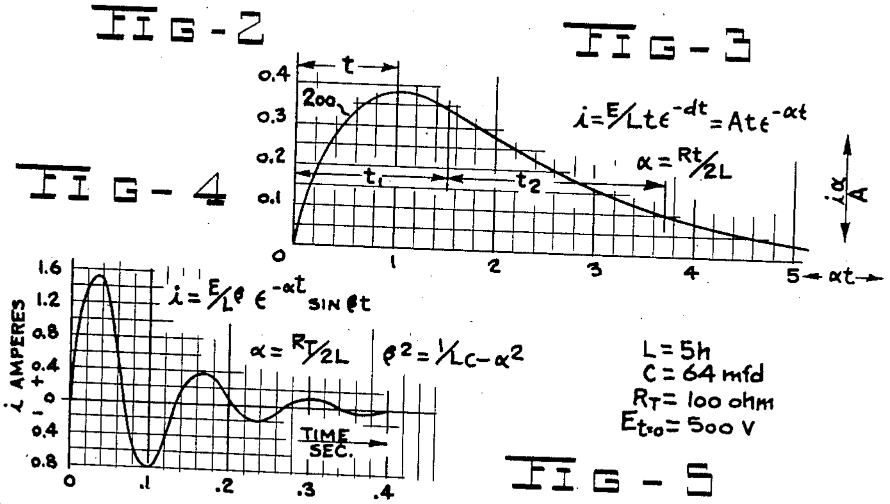
Figs. 4 through 6 are current waveforms which may be produced with the circuit disclosed in Fig. 1.

When the circuit is critically damped, the solution of Equation 1 for current becomes $$i=\frac{E}{L}t\epsilon^{-\alpha t} \qquad (1)$$

and $$i_{max}=\frac{2E}{R_t}\epsilon^{-1} \qquad (2)$$

where $$\alpha=\frac{R_t}{2L}$$

and the waveform has the shape illustrated in Fig. 4.

The welding is accomplished during the period designated $t_1$. When current begins to diminish, the weld is annealed, this annealing period being indicated by the time interval $t_2$ in Fig. 4. The current wave rises to a maximum value when $$t=\frac{1}{\alpha}$$

For critical damping, the total resistance, $R_t$, of the circuit must have a value of $$R_t=2\sqrt{\frac{L}{C}}$$

It is clear from the above equations that the welding and annealing periods provided by the critically damped circuit may be changed by merely changing the settings of inductor 20, capacitor 21, and resistor 22 so that the equations remain satisfied. It is also clear that the two periods cannot be adjusted independently, since the adjustment of period $t_1$ will effect period $t_2$. However, settings of the variable inductor, capacitor, and resistor may be found for satisfying the two requirements, i. e., for producing good welds as well as annealing them.

It will be recognized from Equation 2 that the maximum current is a function of voltage E and total resistance $R_t$ of the circuit. Therefore, rheostat or resistor 22 is used in the critically damp circuit primarily for limiting or controlling the maximum current appearing in the circuit during any given duty cycle irrespective of whether this duty cycle is considered when the network is charging or discharging.. Therefore, when the critically damped circuit is used, the maximum value of current is preselected for producing a satisfactory weld. After this current is determined, one chooses the maximum voltage E suitable for this circuit, this maximum voltage being determined by the voltage rating of the capacitor and other circuit elements.

A suitable time $t_{i_{max}}$, which is the time required for the current wave to reach its maximum amplitude, is selected from the previously determined behavior of the whisker-crystal combination when subjected to welding. This time is not especially critical and may be, for example, of the order of .4 second. The inductance of the circuit is then determined next from the equation $$t_{i_{max}}=\frac{2L}{R_t}$$

Having determined the value of inductance, the capacitance of the circuit may then be determined from the equation $$C=\frac{4L}{R_t^2}$$

It may be noted here that since the only critical factor is the maximum current, it follows that wide variation in the parameters of the circuit are possible.

The following values have been found to provide a critically damped welding signal which produces uniform, stable, and reproducible welded diodes with the circuit disclosed in Fig. 1:

| | |
|---|---|
| Voltage of potential source__________volts__ | 45 |
| Total resistance $R_t$ of the circuit, including the resistance of diode ___________ohms__ | 45.7 |
| Inductance of coil 20 _____________henrys__ | 10 |
| Capacity of condenser 21 _________farads__ | .019 |
| Resistance of rheostat 22 ___________ohms__ | 20.7 |

| | | |
|---|---|---|
| Approximate duration of welding period $t_1$ | sec | .9 |
| Approximate duration of annealing period $t_2$ | sec | 1.0 |
| Maximum welding current | milliamperes | 724 |
| Whisker diameter | inch | .003 |
| Diameter of whisker point | inch | .0002–.0003 |
| Composition of whisker | | platinum-ruthenium, platinum-rhodium, platinum-iridium, or similar alloys of platinum |

When welding a point-contact germanium diode, for example, the welding operation is performed after the whisker is advanced approximately .002″ into the germanium, whereupon the network is connected to the whisker-germanium crystal combination for producing the weld.

Still another characteristic of the welding and annealing circuit of the invention is that the maximum current may be adjusted over wide limits. Therefore, a preselected amount of circuit parameters permits adjustment of the energy to be furnished by the welding and annealing pulse to the contact area between the cat whisker and the semi-conductor. In addition, the rate of supplying this energy for obtaining the weld, and the rate of decay of this energy for annealing the obtained weld may be accurately controlled. Thus, the circuit enables one to adjust, at will, all the critical values that can exist in producing the weld.

When the circuit shown in Fig. 1 is not critically damped, the solution of Equation 1 for the transient current includes a term conventionally called $\beta$, where $$\beta^2=\frac{1}{LC}-\frac{R^2{}_t}{4L^2}$$

When $\beta$ is greater than zero, an oscillatory condition exists, as illustrated in Fig. 5.

Although satisfactory welds are obtainable with a welding pulse having the waveform illustrated in Fig. 5, it is nevertheless preferable to use a welding pulse having the waveform illustrated in Fig. 4 because it furnishes a better annealing characteristic than the oscillatory wave illustrated in Fig. 5. If there is any advantage in employing a welding pulse having the waveform illustrated in Fig. 5, it is when ionization and diffusion of the melted electrode into the semiconductor may occur. The alternating nature of the oscillatory wave will produce less diffusion than the wave illustrated in Fig. 4.

Figure 6:
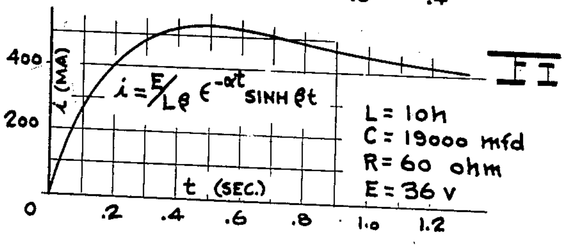

The circuit illustrated in Fig. 1 may also be over-damped by increasing the setting of rheostat 22, in order to provide a welding and annealing pulse having the waveform illustrated in Fig. 6. More gradual welding and longer annealing periods are obtained with this waveform.

It is clear from the curves illustrated in Figs. 4 through 6 that a minimum amount of energy is used for obtaining the weld and annealing when the welding circuit is critically damped. In addition, welding and annealing are obtained in a shorter period of time, and therefore, the critically damped circuit is especially suitable for use with automatic machinery.

When the circuit of Fig. 1 is used in cooperation with automatic machinery, relay winding 28 is connected to a timer 30 which may time not only the operation of the circuit of Fig. 1, but also the operation of other functional cycles in the process of manufacturing diodes, as set forth in copending U. S. patent application, Serial No. 268,385, for "Methods and Apparatus for Assembling Semiconductor Devices," by Justice N. Carman, filed January 9, 1952. In operation, a current of predetermined duration and magnitude is furnished to winding 28, for moving armature 16 from one of its associated contacts to the other. Armature 16 therefore always rests either on contact 17 or contact 13 so that the circuit may be employed for welding either one or two diodes, as set forth hereinabove.

It will be recognized that the circuit of this invention may also be employed for welding a plurality of parallel connected diodes simultaneously. However, the circuit should be modified to include a larger condenser to supply the necessary current to each parallel branch, assuming that the voltage of the source 10 of direct current potential remains constant. The resistor 22 and inductor 20 are then given values in accordance with the equations discussed previously.

Figure 2:
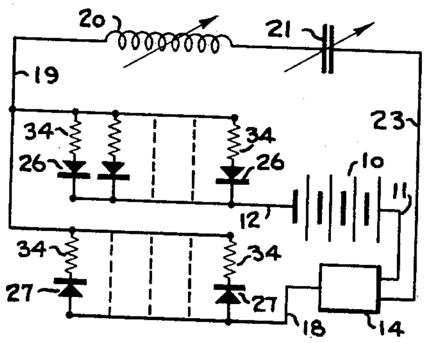
Figs. 2 and 3 are modified versions of the circuit disclosed in Fig. 1.

As illustrated in Fig. 2, the welding circuit may also be modified by eliminating resistor 22 altogether and inserting a corresponding plurality of resistors 34 in each of the parallel branches. The value of each of the resistors 34 should then be N times the value of the resistance 22, where N is the number of parallel branches. In addition, the output voltage from source 10 must be increased N times over that used for one diode. The values of condenser 21 and inductor 20 may then remain substantially the same as the values employed when the circuit is utilized for welding a single diode.

Figure 3:
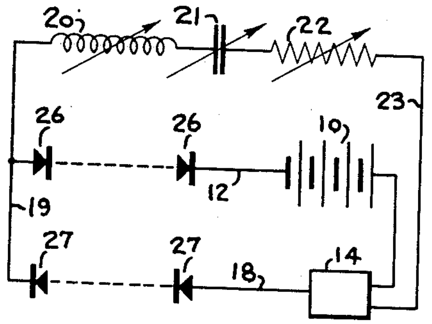

Referring now to Fig. 3, there is shown another modification of the welding circuit in which a plurality of diodes are serially connected in each branch of the circuit. In this case, the value of C and the value of L remain substantially the same as the values selected for welding a single diode. The setting of rheostat 22 is decreased, however, to the value required to produce critical damping, assuming that the critical damping mode of operation is preferred.

Past experience with semiconductor diodes indicates that the performance characteristics may be improved by "pulsing" the diodes by applying either a direct or alternating current signal to the device, as described by Torrey and Whitmer in "Crystal Rectifiers," Radiation Laboratory Series, volume 15, page 370. This "pulsing" technique has been found to increase their back resistance and decrease their forward resistance.

The circuit illustrated in Fig. 1 may also be used for pulsing semiconductor diodes in this manner. The setting of rheostat 22 may be adjusted to produce the type of pulse illustrated at 200 in Fig. 4, or the type of pulse illustrated in Fig. 5. The above type of pulses not only increases the back resistance and decreases the forward resistance, but contributes to the stability of the diodes over a period of time.

The pulsing technique set forth above is not especially critical with welded contact diodes. However, it is quite critical with high frequency diodes where pressure contacts or very small welds are used, since burn-outs or destruction of the diodes occurs quite readily during the pulsing operation, unless the amount of energy supplied to the rectifying area is carefully controlled. Accordingly, the use of the disclosed circuit for pulsing high-frequency devices represents a unique solution of the pulsing problem.

What is claimed as new is:

1. An electrically annealed circuit for producing an electrical weld first between the crystal and whisker elements of a first semiconductor device and then between the crystal and whisker elements of a second semiconductor device, said circuit including: a pulse forming network having a serially-connected inductor, condenser and resistor; a direct current source connected in series with said first semiconductor device, and means for sequentially connecting said network first across said source and said first semiconductor device for a first predetermined interval for charging said network, to produce said annealed weld between said elements of said first semiconductor device, said means disconnecting said network from said first semiconductor device and said source at the end of said first predetermined time interval and connecting said charged network across said second semiconductor device for a second predetermined time interval for discharging the charged network to produce said annealed weld between the elements of said second semiconductor device.

2. A circuit for sequentially producing an electrically annealed weld first between the crystal and electrode elements of a first semiconductor device and second between the crystal and electrode elements of a second semiconductor device; said circuit including an electrical network having a series connection of an inductor, a condenser, and a resistor; a source of direct current potential; a relay having an armature and, first and second contacts, and timing means for connecting said armature first to said first contact for a first predetermined time interval and then to said second contact for a second predetermined time interval; said armature, when connected to said first contact, completing a series circuit between said source, said first semiconductor device and said network, whereby said network is charged from said source to a potential substantially equal to the potential of said source, the charging of said network producing an annealed weld between the crystal and electrode elements of said first semiconductor device; said armature, when connected to said second contact, completing a series discharge circuit between the charged network and said second semiconductor device, the discharging of said network across said second semiconductor device producing an annealed weld between the crystal and electrode elements of said second semiconductor device.

3. A circuit for successively producing an electrical weld between the crystal and electrode elements of a semiconductor device and annealing said weld, said elements having a limited area of contact and requiring a predetermined quantity and a predetermined rate of supplying electrical energy to said area for producing and annealing said weld, said circuit including: a series connection of said semiconductor device, a source of direct current potential, an inductor, a condenser and a resistor; and timing means for closing said circuit, the total resistance of said circuit being substantially equal to two times the square root of the ratio of the inductance to the capacitance of said circuit, whereby said circuit is critically damped, the instantaneous current flowing through said circuit being in accordance with the equation $$i=\frac{E}{L}t\epsilon^{-\alpha t}$$

where $$\alpha=\frac{R_t}{2L}$$

and $i$=instantaneous current in amperes
E=voltage of source in volts
L=inductance in henries
$t$=time in seconds
$\epsilon$=base of napierian logarithm
$R_t$=total resistance of the circuit in ohms.

4. A circuit for producing an electrically annealed weld between the crystal and whisker elements of a first semiconductor diode and then between the crystal and whisker elements of a second semiconductor diode; said circuit including a network comprising a serially-connected inductor, condenser, and a resistor; first and second series circuits; means for including said network first in said first series circuit and then in said second series circuit; said first series circuit comprising a source of direct potential, said first semiconductor diode, said network and said means; and said second series circuit comprising sadi means, said second semiconductor diode and said network; and a source of timing signals connected to said means, said source of timing signals periodically energizing said means for completing in alternate succession first and second series circuits, whereby the elements of said first semiconductor diode are welded together and annealed by a network charging current produced by said source, and the elements of said second semiconductor diode are welded and annealed by a discharge current produced by the charged network.

5. An electrical apparatus for successively welding and annealing the crystal element and whisker element of a semiconductor device, said apparatus comprising: a series network having first and second terminals, said network including a resistor, a capacitor and an inductor; first and second circuits each having first and second terminals, the first terminal of each of said circuits being connected to said first terminal of said network, said first circuit including a source of direct-current potential and first connecting means for connecting a first semiconductor device in series with said source, said second circuit including second connecting means for connecting a second semiconductor device between the respective first and second terminals of said second circuit; and sequentially timed switching means operable in a first position for a first predetermined interval for connecting said second terminal of said first circuit to said second terminal of said network to charge said network from said source, the charging current produced thereby successively welding and annealing the crystal and whisker elements of said first semiconductor device; said switching means being operable in a second position for a second predetermined interval for connecting said second terminal of said second circuit to said second terminal of said network to discharge said network, the discharge current produced thereby successively welding and annealing the crystal and whisker elements of said second semiconductor device.

6. The electrical apparatus defined in claim 4 wherein the inductance and capacitance of said network, and the total resistance of said network and one of said circuits conform substantially with the relationship:

$$R_t=2\sqrt{\frac{L}{C}}$$

where $L$=inductance of said inductor in henries;

$C$=capacitance of said capacitor in farads;

$R_t$=total resistance of said network and said one circuit.

References Cited in the file of this patent

UNITED STATES PATENTS

| Number | Name | Date |
|---|---|---|
| 1,299,150 | Dyer | Apr. 1, 1919 |
| 2,077,600 | Watson | Apr. 20, 1937 |
| 2,184,628 | Watson | Dec. 26, 1939 |
| 2,451,496 | Klemperer | Oct. 19, 1948 |

FOREIGN PATENTS

| Number | Country | Date |
|---|---|---|
| 486,307 | Great Britain | June 1, 1938 |
| 548,618 | Great Britain | Oct. 16, 1942 |
| 569,540 | Great Britain | May 29, 1945 |